United States Patent
Sato (10) Patent No.: US 9,122,190 B2
(45) Date of Patent: Sep. 1, 2015

(54) IMAGE FORMING APPARATUS CAPABLE OF ADJUSTING LASER BEAMS EMITTED FROM A PLURALITY OF LIGHT SOURCES, AND METHOD OF CONTROLLING IMAGE FORMING APPARATUS

(71) Applicant: CANON KABUSHIKI KAISHA, Tokyo (JP)

(72) Inventor: Hiroki Sato, Toride (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/495,034

(22) Filed: Sep. 24, 2014

(65) Prior Publication Data

US 2015/0085051 A1 Mar. 26, 2015

(51) Int. Cl.
*B41J 2/385* (2006.01)
*B41J 2/47* (2006.01)
*G03G 15/041* (2006.01)
*G03G 15/04* (2006.01)

(52) U.S. Cl.
CPC ...... *G03G 15/0415* (2013.01); *G03G 15/04036* (2013.01)

(58) Field of Classification Search
CPC .............. G03G 15/04036; G03G 15/0415
USPC ............. 347/250, 224, 118, 235; 355/47
See application file for complete search history.

(56) References Cited

U.S. PATENT DOCUMENTS

| 2004/0174428 A1* | 9/2004 | Seki et al. ............... 347/250 |
| 2006/0055902 A1* | 3/2006 | Ohkawara et al. ........ 355/47 |
| 2011/0025813 A1* | 2/2011 | Suzuki et al. ............ 347/224 |
| 2013/0286133 A1* | 10/2013 | Furuta et al. ........... 347/118 |
| 2013/0286144 A1* | 10/2013 | Nakahata .............. 347/224 |

FOREIGN PATENT DOCUMENTS

JP 08051536 A 2/1996

* cited by examiner

*Primary Examiner* — Julian Huffman
*Assistant Examiner* — Carlos A Martinez
(74) *Attorney, Agent, or Firm* — Rossi, Kimms & McDowell LLP (57) ABSTRACT

An image forming apparatus which makes it possible to grasp such settings of a phase and a main scanning magnification of laser beams as reduce occurrence of moire, by visually checking a plurality of pattern images. Pattern images are formed using a laser beam irradiated from a reference light source and a laser beam irradiated from an adjustment target light source for which each of different phase values is set as a phase setting value. A phase relationship between the phases of the laser beams is adjusted based on the pattern images. Pattern images are formed using a laser beam irradiated from the adjustment target light source for which each of different magnification values is set as a magnification setting value. The magnification of the laser beams is adjusted based on these pattern images.

9 Claims, 10 Drawing Sheets

ANGULAR SPEED:
ω (CONSTANT)

CIRCULAR MOTION:
v = ω × r

(r = RADIUS OF CIRCLE OF CIRCULAR MOTION)

IMAGE FORMING APPARATUS CAPABLE OF ADJUSTING LASER BEAMS EMITTED FROM A PLURALITY OF LIGHT SOURCES, AND METHOD OF CONTROLLING IMAGE FORMING APPARATUS

BACKGROUND OF THE INVENTION

1. Field of the Invention

The present invention relates to a technique for suppressing moire in an image forming apparatus that forms an image using laser beams emitted from a plurality of light sources.

2. Description of the Related Art

Conventionally, there has been known an image forming apparatus that is equipped with an exposure device including a plurality of light sources, that is, a multi-beam laser scanner. In this image forming apparatus, the laser beam has a variation in exposure position interval (phase interval) in a main scanning direction on a photosensitive drum between individual laser beams emitted from the laser scanner, and also has a variation in the main scanning magnification between the same. With the use of multiple laser beams, when the frequency (space frequency) of such a variation occurring with an image becomes large, the image is more likely to be noticed as a defective image by human eyes. Moire (interference fringes) generated by a space frequency causing interference with an image pattern of an original is one of easily visually noticeable image defects.

Japanese Patent Laid-Open Publication No. H08-51536 discloses a technique of suppressing generation of moire, by detecting a space frequency causing moire due to its relation with writing density of image data, and performing filtering processing on a space frequency which has not a relation of a common multiple with the detected space frequency (moire-causing space frequency).

Figure 10A:
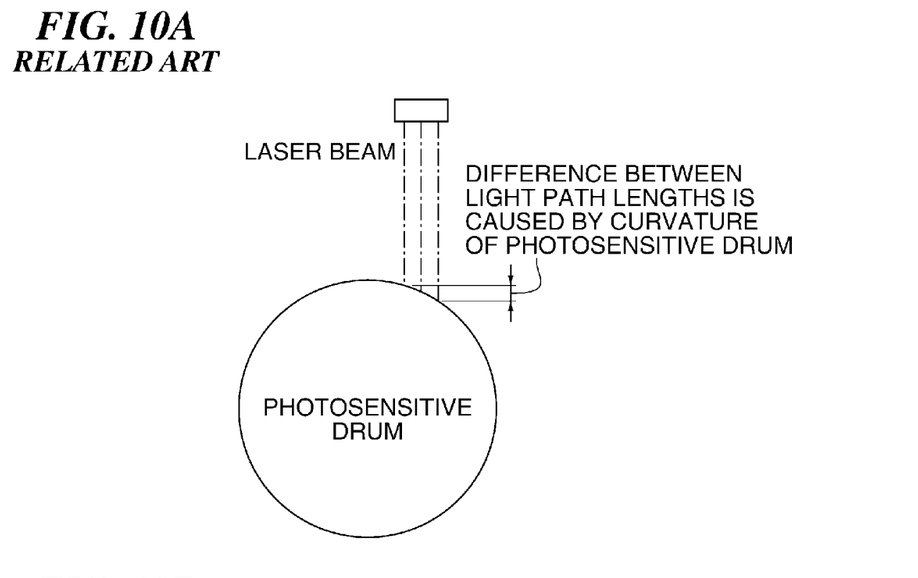
FIGS. 10A and 10B are schematic diagrams useful in explaining an influence that a difference in the length of a light path has on a main scanning magnification.

Causes of variations in the phase interval between the exposure positions of laser beams and main scanning magnifications of the laser beams include variations in the lengths of light paths that extend from light sources to the photosensitive drum. In the multi-beam laser scanner, as shown in FIG. 10A, the lengths of light paths of respective laser beams emitted from a laser diode to the photosensitive drum are different due to the curvature of the photosensitive drum. An influence that the difference between the lengths of the light paths has on the main scanning magnification will be described with reference to FIG. 10B.

Figure 10B:
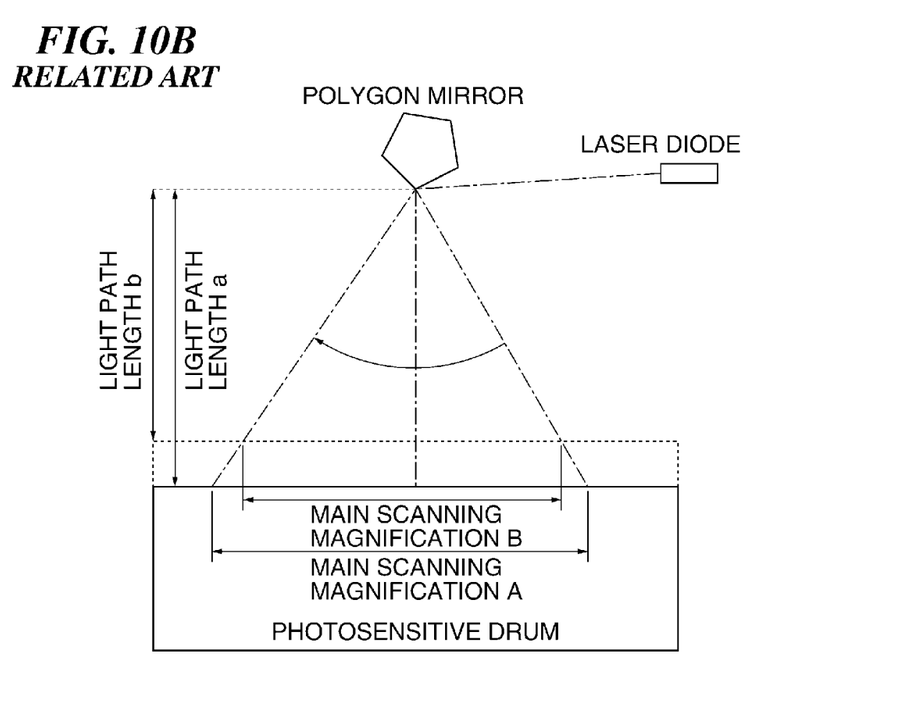

FIG. 10B shows a state in which a laser beam emitted from the laser diode scans the surface of the photosensitive drum using a polygon mirror. The laser beam is scanned by the polygon mirror in such a manner that the scanned path forms a triangular shape as shown in FIG. 10B. Therefore, when the length of a light path (light path length) between the polygon mirror and the photosensitive drum is equal to "a", the main scanning magnification is equal to "A", whereas when the length of a light path is shorter than "a" and is equal to "b", the main scanning magnification as well also becomes smaller and is equal to "B" ($B=A \times b/a$).

It is envisaged that such a difference between the lengths of light paths can be corrected by estimating the difference in advance. However, the curvature of the photosensitive drum varies between individual photosensitive drums. Further, a variation in the length of the light path is inevitably caused also by a mounting tolerance of the laser scanner in a main body of the image forming apparatus.

In the method of correcting moire disclosed in Japanese Patent Laid-Open Publication No. H08-51536, moire reduction processing is performed on image data without taking the variation in the length of the light path into account. Therefore, there are possibilities that filtering processing is sometimes performed on an image in which no moire is actually generated and that filtering processing is sometimes not performed on an image in which moire is generated. To eliminate such inconvenience, it is envisaged that if it is possible to grasp a relationship between the phase interval between laser beams and main scanning magnification and a degree of generation of moire, suppression of moire can be performed based on the relationship.

SUMMARY OF THE INVENTION

The present invention provides an image forming apparatus which makes it possible to grasp such settings of a phase and a main scanning magnification of laser beams as reduce occurrence of moire, by visually checking a plurality of pattern images.

In a first aspect of the present invention, there is provided an image forming apparatus comprising a photosensitive member that is driven for rotation, an exposure device that includes a plurality of light sources for emitting a plurality of laser beams, respectively, said plurality of light sources being arranged to expose respective different positions in a sub scanning direction which is a rotational direction of said photosensitive member, an image formation unit configured to form an image by developing an electrostatic latent image formed on said photosensitive member, a first adjustment unit configured to adjust, by changing a phase setting value, a phase relationship between exposure positions of the plurality of laser beams on said photosensitive member, which is a relative positional relationship between an exposure position of a laser beam irradiated from a reference light source of the plurality of light sources in a main scanning direction of the laser beam perpendicular to the sub scanning direction, and an exposure position of a laser beam irradiated from an adjustment target light source other than the reference light source, a second adjustment unit configured to adjust a scanning magnification of the laser beam irradiated from each of the plurality of light sources, by changing a magnification setting value, a first control unit configured to control said exposure device and said image formation unit, such that a plurality of phase adjustment pattern images for adjusting the phase relationship are each formed, using the laser beam irradiated from the reference light source and the laser beam irradiated from the adjustment target light source for which each of phase values different from each other is set as the phase setting value, according to each of the phase values different from each other, and a second control unit configured to control said exposure device and said image formation unit, such that a plurality of magnification adjustment pattern images are each formed, using the laser beam irradiated from the adjustment target light source for which each of magnification values different from each other is set as the magnification setting value, according to each of the magnification values different from each other.

In a second aspect of the present invention, there is provided a method of controlling an image forming apparatus including a photosensitive that is driven for rotation, an exposure device that includes a plurality of light sources for emitting a plurality of laser beams, respectively, said plurality of light sources being arranged to expose respective different positions in a sub scanning direction which is a rotational direction of said photosensitive member, an image formation unit configured to form an image by developing an electrostatic latent image formed on said photosensitive member, a first adjustment unit configured to adjust, by changing a phase setting value, a phase relationship between exposure positions of the plurality of laser beams on said photosensitive member, which is a relative positional relationship between an exposure position of a laser beam irradiated from a reference light source of the plurality of light sources in a main scanning direction of the laser beam perpendicular to the sub scanning direction, and an exposure position of a laser beam irradiated from an adjustment target light source other than the reference light source, and a second adjustment unit configured to adjust a scanning magnification of the laser beam irradiated from each of the plurality of light sources, by changing a magnification setting value, the method comprising controlling the exposure device and the image formation unit, such that a plurality of phase adjustment pattern images for adjusting the phase relationship are each formed, using the laser beam irradiated from the reference light source and the laser beam irradiated from the adjustment target light source for which each of phase values different from each other is set as the phase setting value, according to each of the phase values different from each other, and controlling the exposure device and the image formation unit, such that a plurality of magnification adjustment pattern images are each formed, using the laser beam irradiated from the adjustment target light source for which each of magnification values different from each other is set as the magnification setting value, according to each of the magnification values different from each other.

According to the present invention, it is possible to grasp such settings of the phase and the main scanning magnification of laser beams as reduce occurrence of moire, by visually checking a plurality of pattern images.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1:
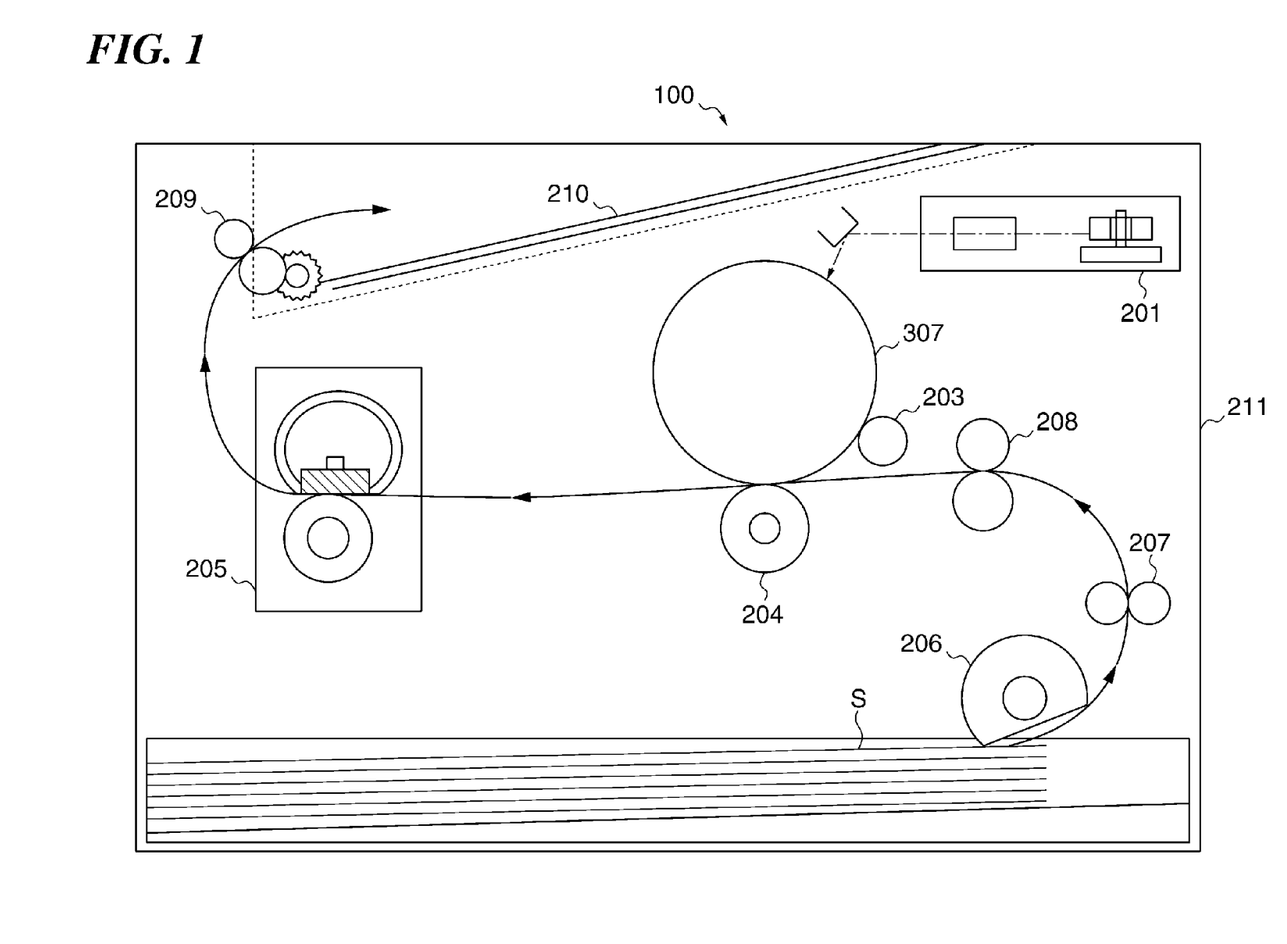
FIG. 1 is a schematic cross-sectional view of an image forming apparatus according to an embodiment of the present invention.

FIG. 1 is a schematic cross-sectional view of an image forming apparatus according to an embodiment of the present invention. This image forming apparatus 100 has an interchangeable exposure device 201 mounted on an image forming apparatus main body 211. The image forming apparatus 100 can be commercially manufactured as a copy machine, a printer, a printing apparatus, a facsimile machine, or a multi-function peripheral.

The exposure device 201 irradiates a laser beam (beam) onto a surface of a photosensitive drum 307, as a photosensitive member of the image forming apparatus main body 211, which is driven for rotation and has been uniformly charged. The rotational direction of the photosensitive drum 307 is set as a sub scanning direction. As a consequence, an electrostatic latent image corresponding to an image to be printed is formed on the surface of the photosensitive drum 307.

A developing device 203 including a developing roller develops the electrostatic latent image on the photosensitive drum 307 using developer. A transfer device 204 including a transfer roller transfers a developer image from the photosensitive drum 307 to a recording medium S. A fixing device 205 fixes the developer image onto the recording medium S. Thus, an image is formed on the recording medium S.

The image forming apparatus main body 211 further includes a sheet feed roller 206 that feeds recording media S, one sheet by one sheet, separately, as a roller for feeding and conveying a recording medium S, and a registration roller 208 for conveying the recording medium S to an image transfer position at which the transfer device 204 performs image transfer, at a predetermined timing. The image forming apparatus main body 211 further includes a conveying roller 207 for conveying the recording medium S from the sheet feed roller 206 to the registration rollers 208, and a discharge roller 209 for discharging the recording medium S having an image formed thereon to a discharged sheet accommodation section 210.

Figure 2:
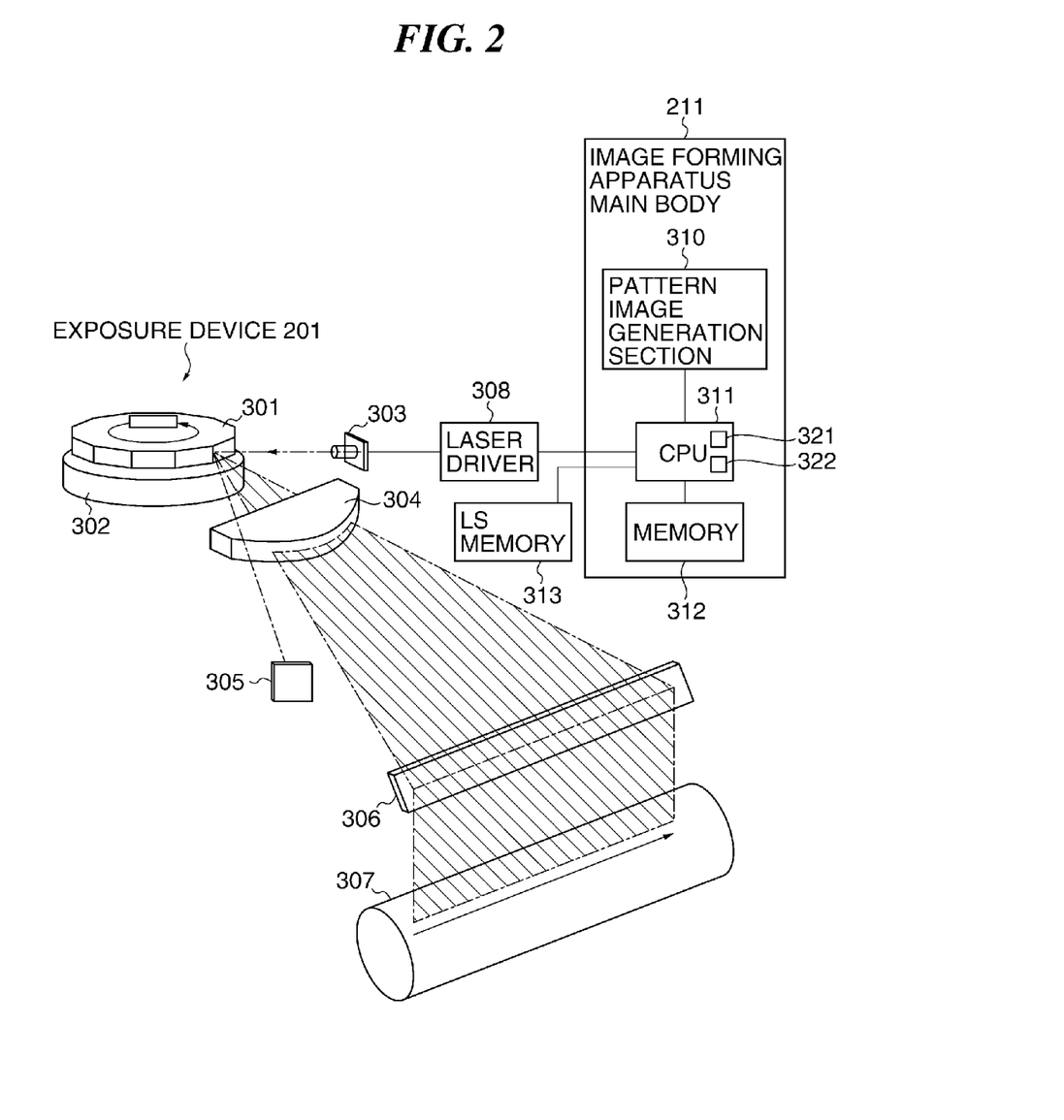
FIG. 2 is a diagram of the arrangement of an exposure device and a relationship between the exposure device and an image forming apparatus main body.

FIG. 2 is a diagram of the arrangement of exposure device 201 and a relationship between the exposure device 201 and the image forming apparatus main body 211.

The exposure device 201 is a laser scanner having a so-called multi-beam configuration, and an LD (Laser Diode) 303 has a plurality of light sources. The plurality of light sources are mounted on the exposure device 201 such that exposure positions of a plurality of laser beams for exposing the photosensitive member are inclined with respect to a scanning direction of the laser beams (main scanning direction perpendicular to the sub scanning direction) and the rotational direction of the photosensitive member (sub scanning direction). By disposing the light sources as described above, it is possible to reduce spacing between the exposure positions of the adjacent laser beams in the sub scanning direction, thereby making it possible to enhance the resolution of an image to be formed. In the exposure device 201, the plurality of laser beams emitted from the LD 303 enter a polygon mirror 301 rotated by a polygon motor 302. The laser beams reflected by the polygon mirror 301 pass through an fθ lens 304, and are reflected by a reflection mirror 306, for scanning on the rotating photosensitive drum 307.

Further, the exposure device 201 includes not only a BD (Beam Detect) sensor 305 for synchronization with writing start timing but also an LS (Local Store) memory 313 and a laser driver 308. On the other hand, the image forming apparatus main body 211 includes a CPU 311, a pattern image generation section 310, and a memory 312. When image data is sent from the CPU 311 to the laser driver 308, the laser driver 308 controls light emission of the LD 303 according to the image data. Further, the CPU 311 is equipped with a main scanning magnification register 321 and a laser phase interval register 322.

Figure 3:
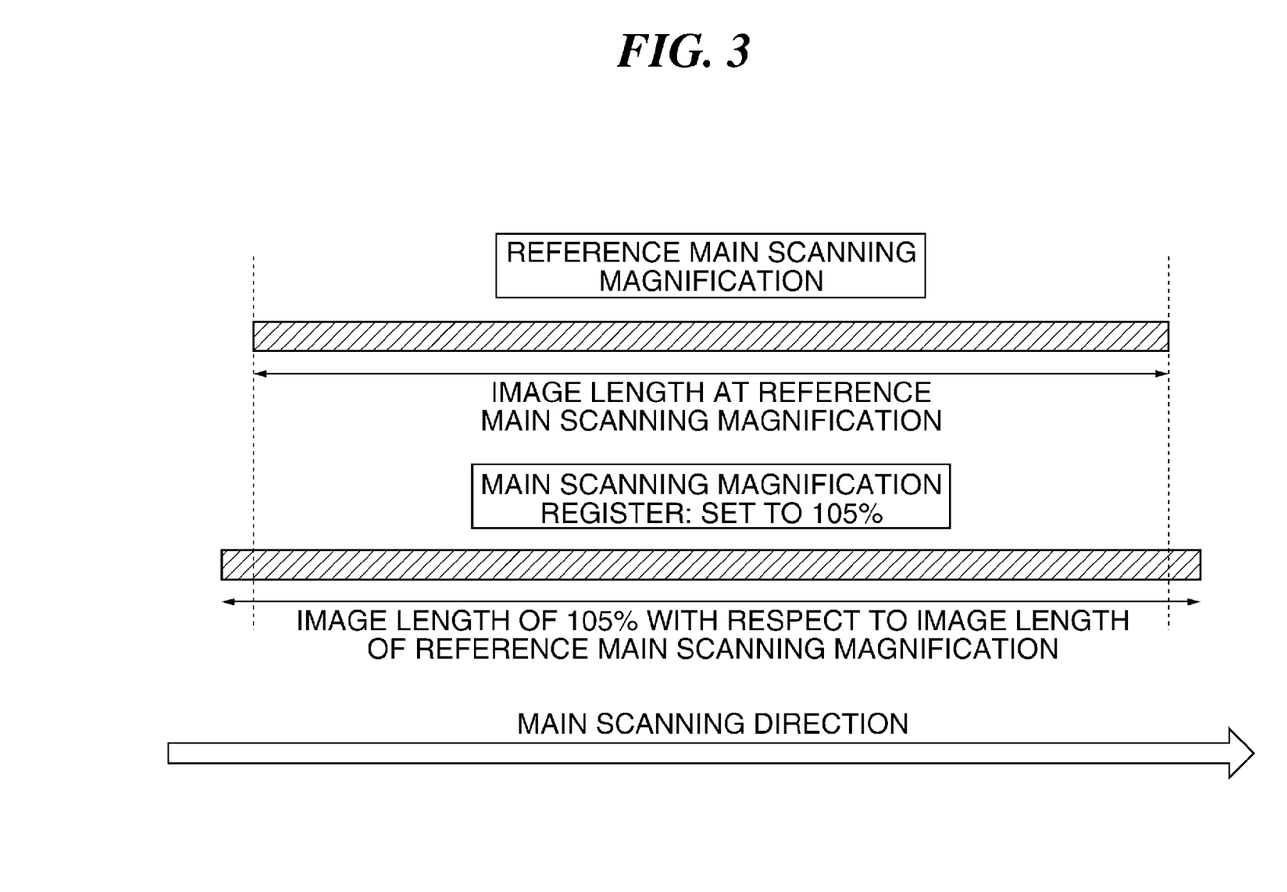
FIG. 3 is a diagram showing changes in a main scanning magnification caused by settings of a main scanning magnification register.

FIG. 3 is a diagram showing changes in a main scanning magnification caused by settings of the main scanning magnification register 321.

The axial direction of the rotational axis of the columnar photosensitive drum 307 is the main scanning direction of the exposure device 201, and the circumferential direction of the photosensitive drum 307 is the sub scanning direction of the exposure device 201. The main scanning magnification represents the degree of expansion or reduction of a formed image in the main scanning direction.

A register value, which defines an expansion/reduction ratio in the main scanning direction with respect to a magnification serving as a reference (hereinafter referred to as the "reference main scanning magnification"), is set in the main scanning magnification register 321. The register value is defined e.g. by "%" as a ratio of a length to a corresponding length in the reference main scanning magnification. When 105% is set as the register value as in the example illustrated in FIG. 3, an image is formed which has an image length made longer (expanded) by 5% than the length of an image formed by the reference main scanning magnification. The image length is adjusted with reference to a center of the image in the main scanning direction. The adjustment of the main scanning magnification can be performed e.g. by frequency modulation of an image clock based on a value set in a normal output register.

More specifically, the main scanning magnification of the laser beam which is irradiated from each of the plurality of light sources when the photosensitive drum 307 is scanned can be adjusted by changing a magnification setting value set in the main scanning magnification register 321 (second adjustment unit).

Figure 4A:
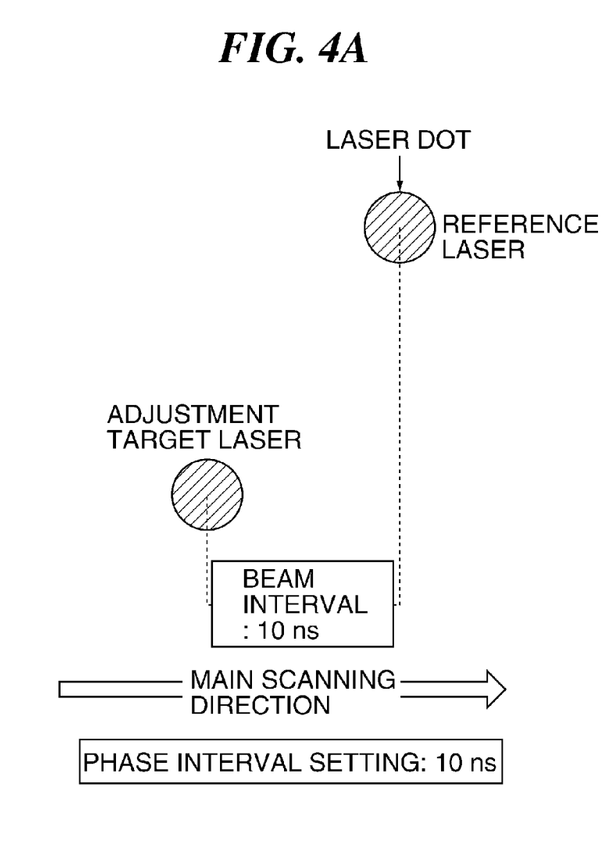
FIGS. 4A and 4B are diagrams showing changes in the phase of a laser beam (beam interval) caused by settings of a laser phase interval register.
Figure 4B:
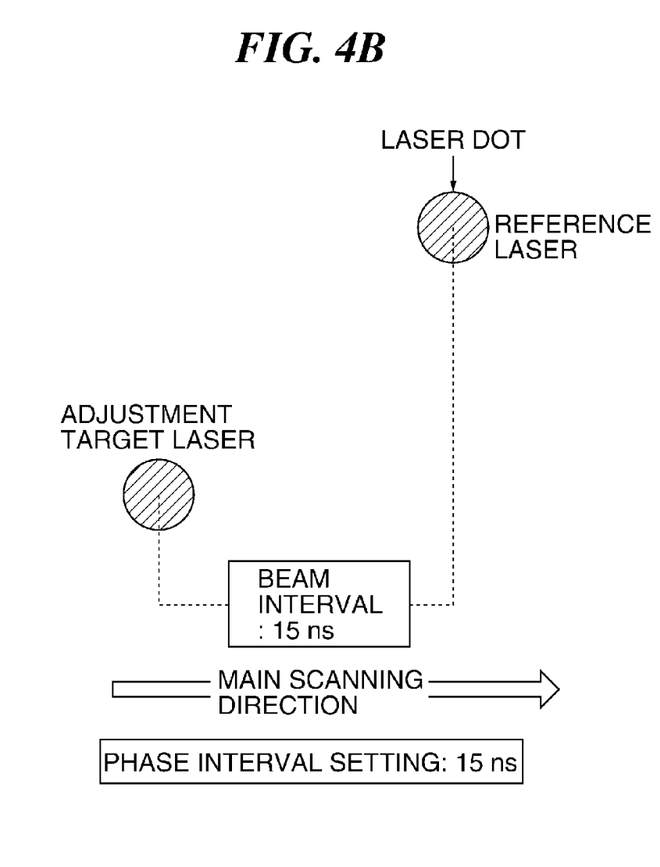

FIGS. 4A and 4B are diagrams showing changes in the phases of the laser beams (beam intervals) caused by the settings of the laser phase interval register 322. In the illustrated example, it is assumed that the phases of laser beams (phase relationship) indicates a relative positional relationship between exposure positions of the plurality of laser beams on the photosensitive member. The phases of laser beams indicate phase differences, from a reference light source serving as a reference (hereinafter referred to as the "reference laser"), of ones (non-reference lasers) of the plurality of light sources other than the reference light source. The phases are set on a light source-by-light source basis. A light source as an object to be adjusted for correction of moire is referred to as the "adjustment target laser". Although the reference laser is not particularly limited, a light source disposed at an end of a row of the light sources is set as the reference laser, by way of example, in the present embodiment.

The laser phase interval register 322 is a register for adjusting phase intervals of non-reference lasers in the main scanning direction with respect to the reference laser according to the register values, by setting light emission timing. The laser phase interval register 322 has time values set therein as register values. For example, FIGS. 4A and 4B show cases where the register values are set to 10 ns and 15 ns, respectively. The phase intervals in the main scanning direction can be adjusted using the register values.

More specifically, the phase of a laser beam irradiated from the adjustment target laser, in the main scanning direction, with respect to a laser beam irradiated from the reference laser, can be adjusted by changing a phase setting value set in the laser phase interval register 322 (first adjustment unit).

By the way, the main scanning magnification register 321 and the laser phase interval register 322 each include an adjustment register whose setting value is reflected only on a moire adjustment pattern image, and the normal output register whose setting value is reflected on a (normal) output image other than the pattern image for adjusting moire. At the startup or the like of the image forming apparatus 100, the CPU 311 reads out a "main scanning magnification setting value" and a "phase interval setting value" from the memory 312, and sets them in the normal output register of each of the main scanning magnification register 321 and the laser phase interval register 322.

Further, at the startup or the like of the image forming apparatus 100, the CPU 311 accesses the LS memory 313 to check a serial number of the exposure device 201 stored in the LS memory 313 to thereby check whether or not the exposure device 201 has been replaced.

The pattern image generation section 310 (FIG. 2) is a component for causing a reference test pattern image, which is preset, to be formed, and is controlled by the CPU 311. Upon receipt of a command from the CPU 311, the pattern image generation section 310 sends image data to the laser driver 308 that controls light emission of the LD 303, whereby the reference test pattern image is output. Further, in the present embodiment, particularly, the pattern image generation section 310 can also cause moire correction pattern images to be formed. As will be described with reference to FIGS. 5 and 7, the moire correction pattern images include pattern images Ga for phase interval adjustment and pattern images Gb for main scanning magnification adjustment.

Figure 5:
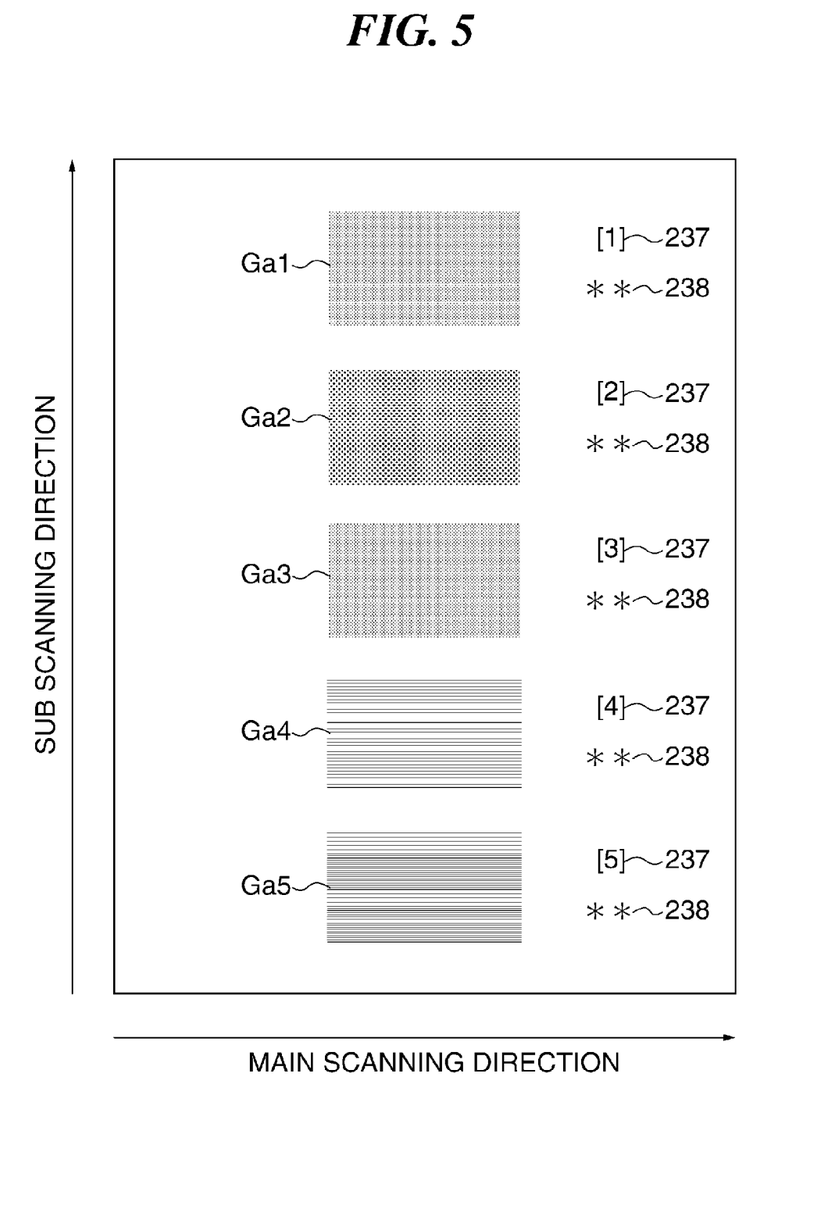
FIG. 5 is a view of an example of pattern images for phase adjustment.

FIG. 5 is a view of an example of the pattern images Ga for phase interval adjustment, which are formed on a recording medium S.

Each of the pattern images Ga (Ga1 to Ga5) is formed by two lasers, i.e. the reference laser and an adjustment target laser. The adjustment target laser can be switched, and all the lasers other than the reference laser are sequentially adjusted. The pattern images Ga1 to Ga5 are formed on an adjustment target laser basis.

The five pattern images Ga (Ga1 to Ga5) are formed in a row in the sub scanning direction at an area with a center (image height 0) in the main scanning direction in its center. The center of each pattern image Ga in the main scanning direction coincides with the image height 0.

In irradiating a laser beam, each light source irradiates the laser beam based on the magnification setting value and the phase setting value set by the CPU 311. The pattern images Ga are formed by the laser beam irradiated from the reference laser and a laser beam irradiated from an associated adjustment target laser. The magnification setting value is set to the reference main scanning magnification for both of the reference laser and the adjustment target laser.

When the pattern image Ga3 located in the center of the pattern images Ga in the sub scanning direction is formed, for example, a register value set in the adjustment register of the laser phase interval register 322 (hereinafter also referred as the "phase interval adjustment register") is reflected on the phase setting value. That is, a laser beam is irradiated from the adjustment target laser based on this register value. The register value of the phase interval adjustment register is initially set to a predetermined initial value, and is thereafter changed for adjustment, on an as-needed basis.

The pattern images Ga are formed by laser beams irradiated based on phase setting values which are set to respective phase values different from each other. Each light source emits a laser beam in light emission timing based on a phase setting value set therefor. Specifically, for example, let it be assumed that a phase setting value for forming the pattern image Ga3 is Fa. In this case, phase setting values for forming the pattern images Ga1 and Ga2 are set to values which are obtained by making the phase interval smaller than the phase setting value for forming the pattern image Ga3 by respective predetermined values (2 ns, 1 ns). Phase setting values for forming the pattern images Ga4 and Ga5 are set to values which are obtained by making the phase interval larger than the phase setting value for forming the pattern image Ga3 by respective predetermined values (1 ns, 2 ns). These predetermined values are only set forth by way of example.

Further, as shown in FIG. 5, each of the pattern images Ga has a number display 237 and a value display 238 added thereto in a manner adjacent to each other. These displays are formed in parallel with formation of the pattern images Ga. The number display 237 is for identifying an associated one of the pattern images Ga, and is displayed using an associated one of serial numbers (e.g. in the form of bracketed numerals), for example. The form of display for identifying each pattern image Ga is not limited to the number display, but any suitable form may be used insofar as it makes it possible for a user to identify and select one of the five pattern images Ga.

For the value display 238, a phase setting value associated with each of the pattern images Ga or a value for identifying the phase setting value is displayed. For example, for the value display 238 associated with the pattern image Ga3, a phase setting value associated with the pattern image Ga3, i.e. a register value (e.g. Fa) of the phase interval adjustment register is displayed. For the value displays 238 associated with the pattern images Ga1, Ga2, Ga4, and Ga5, values different from the register value Fa by respective predetermined values (e.g. Fa−2 ns, Fa−1 ns, Fa+1 ns, Fa+2 ns) are displayed.

The pattern images Ga are formed in the area with the center (image height 0) in the main scanning direction in its center because it is preferable that the pattern images Ga are formed at an area where a laser irradiation position is insusceptible to a change in the main scanning magnification. The reason why a central area is not affected by a change in the main scanning magnification when the main scanning magnification is changed with reference to the center (image height 0) will be described with reference to FIGS. 6A and 6B.

Figure 6A:
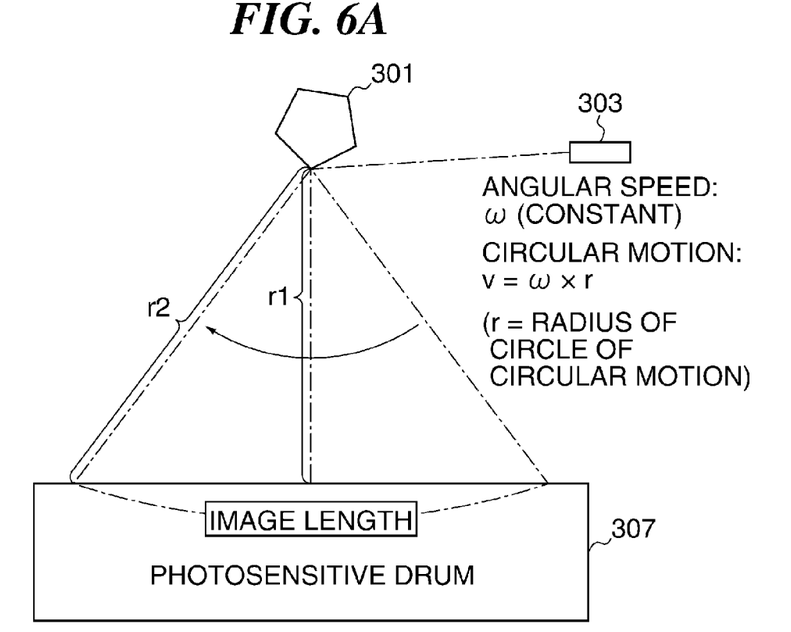
FIGS. 6A and 6B are schematic diagrams each showing a state where a laser beam is reflected by a rotating polygon mirror, and then scans on a photosensitive drum.
Figure 6B:
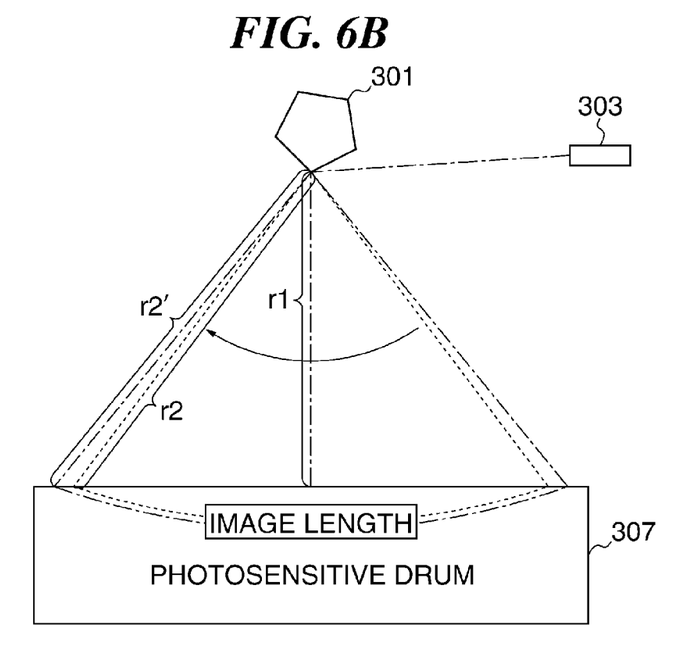

FIGS. 6A and 6B are schematic diagrams showing a state where a laser beam emitted from the LD 303 is reflected by the polygon mirror 301 and then scans on the photosensitive drum 307.

As shown in FIG. 6A, the laser beam that scans the photosensitive drum 307 is scanned with a reflection point on the mirror surface of the polygon mirror 301 as a substantial center of rotation. Although in FIGS. 6A and 6B, distances r1, r2, and r2' are schematically shown, strictly, they are assumed to represent distances from the center of rotation which corresponds to the reflection point on the mirror surface of the polygon mirror 301 to (the surface of) the photosensitive drum 307. Note that strictly, the reflection point on the mirror surface of the polygon mirror 301 moves to different points and hence is not a single point, but the difference therebetween is negligibly small for the following explanation, and hence the explanation is given assuming that the reflection point is a single point.

Since an angular speed ω of the polygon mirror 301 is constant, a speed V (scanning speed on the surface of) the photosensitive drum 307 depends on the distance r from the reflection point on the polygon mirror 301 as the center of rotation to the surface of the photosensitive drum 307. The speed V is approximately derived using a speed formula of a circular motion: v=ω×r.

It is assumed that a distance between the reflection point on the polygon mirror 301 and the center (image height 0) of the surface of the photosensitive drum 307 in the main scanning direction is r1, and a distance between the reflection point on the polygon mirror 301 and an end of an image (image end) in the main scanning direction formed at an end of the surface of the photosensitive drum 307 in the main scanning direction is r2. When an image length (main scanning magnification) is increased from the state shown in FIG. 6A to an image length shown in FIG. 6B, the distance r2 to the image end is increased to the distance r2'. On the other hand, it is understood that the distance r1 at the image height 0 is not changed although the main scanning magnification is changed to change the image length. This is the reason why an image at the image height 0 is not influenced by a change in the main scanning magnification but an image end is strongly influenced by the change.

In the present embodiment, the phase intervals and the main scanning magnification are adjusted for correcting moire in such an order in which the main scanning magnification adjustment is performed after completion of the phase interval adjustment (sometimes also referred to as the "phase adjustment") (the adjustment sequence will be described hereinafter with reference to FIG. 8). To this end, the pattern images Ga are formed at an area where they are insusceptible to a change in the main scanning magnification, whereby the phase interval adjustment is prevented from being canceled by the main scanning magnification adjustment performed after the phase interval adjustment.

The reason why the phase interval adjustment is performed first, and the main scanning magnification adjustment is performed next is further described. This is because a position closer to the image end is more strongly affected not only by a change in the main scanning magnification but also by a change in the phase interval.

As described hereinabove, the phase intervals are adjusted by changing the laser emission timing. Even if the image height 0 and the image end are irradiated, as illustrated in FIGS. 4A and 4B, with two laser beams at the same phase intervals, a difference in distance between the two laser irradiation positions becomes larger when the image end is irradiated. This is the same reason as the reason why the speed V depends on the distance r. As a position is closer to the image end, the distance r between the reflection point on the polygon mirror 301 and the surface of the photosensitive drum 307 becomes larger, and the speed V on the photosensitive drum 307 becomes higher. The phase intervals for irradiating a laser beam are set based on time, so that even if laser beams are irradiated at the same phase intervals, the difference in distance between resulting laser irradiation positions becomes larger for the image end, since the speed V on the photosensitive drum 307 is higher as the irradiation position on the photosensitive drum 307 is closer to an end thereof.

As described above, a change in the phase interval has a large influence on the laser irradiation position at the image end. Therefore, to perform accurate moire correction adjustment, it is necessary to perform the phase interval adjustment first.

Although in the present embodiment, the main scanning magnification is changed with reference to the center (image height 0), the present invention is not limited to this. Therefore, also when the main scanning magnification is changed with reference to a writing start position, it is again preferable to form pattern images Ga at a central area in the main scanning direction where the pattern images Ga are insusceptible to a change in the main scanning magnification.

By the way, the user, such as a service technician, views the pattern images Ga1 to Ga5, and determines one of the pattern images Ga with least occurrence of moire to select the pattern image Ga, whereby a phase setting value set for the selected pattern image Ga is stored in the memory 312. When no excellent pattern image with little moire is found in the five pattern images Ga, it means that there is no appropriate phase setting value in the five phase setting values. In this case, a phase setting value (Fa), which is set as the register value of the phase interval adjustment register, and is used for forming the pattern image Ga3, is changed, and five pattern images Ga having phase setting values different from each other set therefor, are output again. This processing is repeatedly carried out, whereby an optimum phase setting value is eventually stored in the memory 312.

Figure 7:
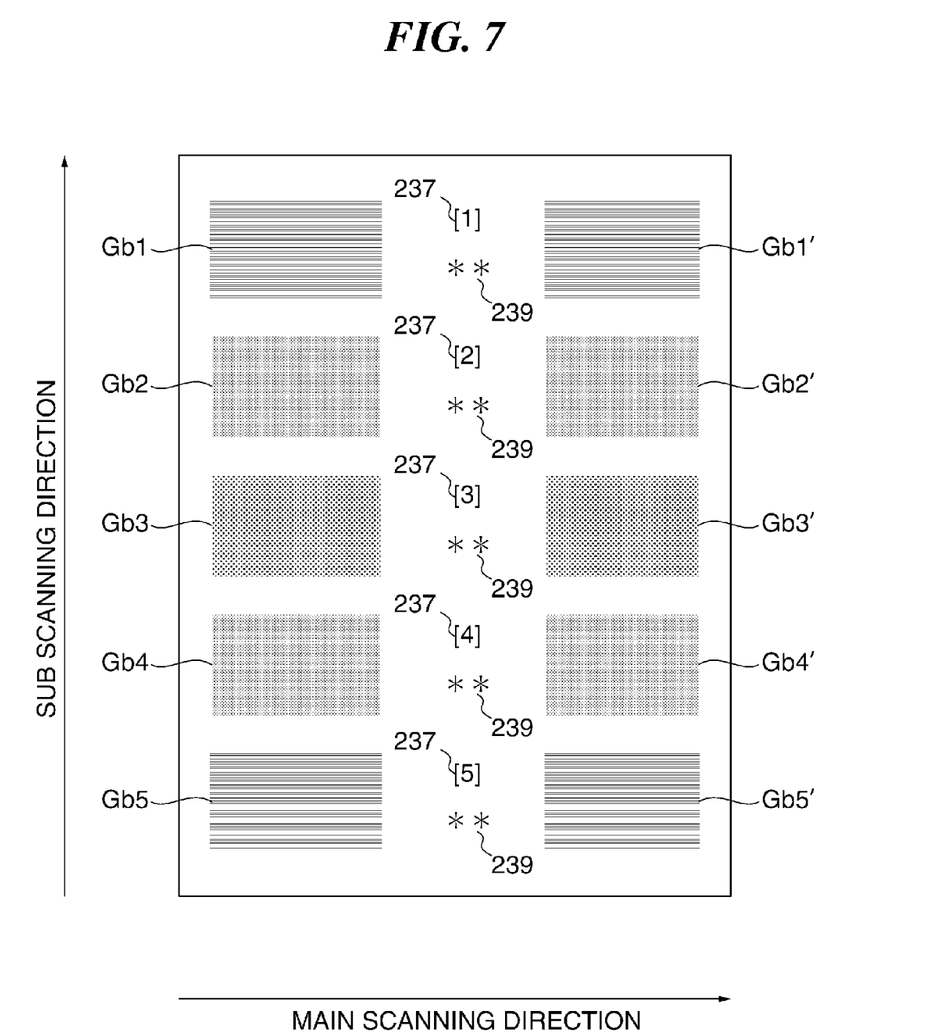
FIG. 7 is a view of an example of pattern images for adjusting the main scanning magnification.

FIG. 7 is a diagram of an example of the pattern images Gb formed on the recording medium S, for adjusting the main scanning magnification.

The pattern images Gb (Gb1 to Gb5, Gb1' to Gb5') are formed by only one adjustment target laser. All the lasers other than the reference laser are sequentially adjusted. The pattern images Gb are formed on an adjustment target laser basis. The pattern images Gb are formed in two rows in the sub scanning direction at opposite ends of the image forming area (and hence the recording medium S) in the main scanning direction. Each pair of the pattern images Gb1 to Gb5 and the pattern images Gb1' to Gb5', which are formed at the same location in the sub scanning direction, respectively, are the same images. Therefore, five kinds of pattern images are formed.

When a laser beam is irradiated from the adjustment target laser, the register value of the phase interval adjustment register is reflected on the phase setting value. At this time, a phase setting value stored in the memory 312 is employed, i.e. read and set, as the register value for phase adjustment. This commonly applies to the 10 pattern images Gb.

On the other hand, as for setting of the magnification setting value, when the pattern images Gb3 and Gb3' located in the middle of the respective rows in the sub scanning direction are formed, a register value of the adjustment register of the main scanning magnification register 321 is reflected on the magnification setting value for each adjustment target laser. The register value of the adjustment register (hereinafter referred to as the "main scanning magnification adjustment register") is initially set to a predetermined initial value, and is thereafter changed for adjustment, on an as-needed basis.

The pattern images Gb1 to Gb5 will be described in detail as a representative. The pattern images Gb are formed by laser beams irradiated based on magnification setting values which are set to respective magnification values different from each other. Specifically, for example, let it be assumed that a magnification setting value for forming the pattern image Gb3 is Fb. In this case, magnification setting values for forming the pattern images Gb1 and Gb2 are set to values which are obtained by making the main scanning magnification larger than the magnification setting value for forming the pattern image Gb3 by respective predetermined values (0.002%, 0.001%). Magnification setting values for forming the pattern images Gb3 and Gb4 are set to values which are obtained by making the main scanning magnification smaller than the magnification setting value for forming the pattern image Gb3 by respective predetermined values (0.001%, 0.002%). The predetermined values are only set forth by way of example.

Further, as shown in FIG. 7, each of the pattern images Gb has a number display 237 and a value display 239 added thereto in a manner adjacent to each other. These displays are formed in parallel with formation of the pattern images Gb. The number display 237 is for identifying an associated one of the pattern images Gb, and is displayed using an associated one of serial numbers, for example. The form of display for identifying each pattern image Gb is not limited to the number display, but any suitable form may be used insofar as it makes it possible for a user to identify and select one of the five pattern images Gb.

For the value display 239, a magnification setting value associated with the associated one of the pattern images Gb is displayed. For example, for the value display 239 associated with the pattern images Gb3 and Gb3', a magnification setting value associated with the pattern image Gb3, i.e. a register value (e.g. Fb) of the main scanning magnification adjustment register is displayed. For the value displays 239 associated with the pattern images Gb1, Gb2, Gb4, and Gb5, values different from the value Fb by respective predetermined values (e.g. Fb+0.002%, Fb+0.001%, Fb−0.001%, Fb−0.002%) are displayed.

The pattern images Gb are formed at the image ends in the main scanning direction because the laser irradiation position is more susceptible to a change in the main scanning magnification at positions closer to the image ends, and if the pattern images Gb are formed at the image ends, it is easier to recognize an adverse effect of variation in the main scanning magnification.

In the present embodiment, since the main scanning magnification is changed with reference to the center (image height 0), the opposite ends of the recording medium S in the main scanning direction are equally susceptible to a change in the main scanning magnification, and therefore the pattern images Gb are formed at the opposite ends of the recording medium S to thereby make it easier to recognize moire. However, when a reference position for adjusting the main scanning magnification is displaced from the center of the image forming area, the five pattern images Gb may be formed only at one of the opposite ends, remote from the reference position.

Further, although in the above-described embodiment, the main scanning magnification is changed with reference to the center (image height 0), the present invention is not limited to this. Therefore, it is only required to determine positions of the pattern images Ga and Gb to be formed, according to the reference position for adjusting the main scanning magnification. That is, it is assumed that the pattern images for phase adjustment Ga are formed at a first position (area) in the main scanning direction. In this case, it is only required to form the magnification adjustment pattern images Gb at second positions (areas) where the laser irradiation position on the photosensitive drum 307 is more susceptible to a change in the main scanning magnification than at the first position (area). It is preferable that the first position (area) is set to a position (area) where the laser irradiation position on the photosensitive drum 307 is least susceptible to a change in the main scanning magnification.

For example, in a case where the employed configuration is such that the main scanning magnification varies with reference to the writing start position, it is only required to form the pattern images Ga at the writing start position, and form the pattern images Gb at a position remote from the writing start position, preferably, at a position remotest therefrom.

Note that as described hereinabove, in the case where the first position (area) where the pattern images Ga are formed is the central part (area) in the main scanning direction, it is preferable that the second positions (areas) where the pattern images Gb are formed are closest to the respective opposite ends, but this is not limitative. That is, positions (area) of the pattern images Gb to be formed are only required to be closer to the opposite ends of the recording medium S in the main scanning direction with respect to the central position (area).

By the way, the user, such as a service technician, views the pattern images Gb1 to Gb5, and determines one of the pattern images Gb with least occurrence of moire to select the pattern image Gb, whereby a magnification setting value set for the selected pattern image Gb is stored in the memory 312. When no excellent pattern image with little moire is found in the five pattern images Gb, it means that there is no appropriate magnification setting value in the five magnification setting values. In this case, a magnification setting value (Fb), which is set as the register value of the main scanning magnification adjustment register, and is used for forming the pattern image Gb3, is changed, and five pattern images Gb having magnification setting values different from each other set therefor, are output again. This processing is repeatedly carried out, whereby an optimum magnification setting value is eventually stored in the memory 312.

The phase setting value and the magnification setting value stored in the memory 312 become the above-described phase interval setting value and main scanning magnification setting value, and at the startup or the like of the image forming apparatus 100 are set in the respective normal output registers of the main scanning magnification register 321 and the laser phase interval register 322. This causes images with little moire to be formed by subsequent normal image formation.

Further, when the moire correction adjustment through the phase adjustment and the magnification adjustment has been completed, the serial number of the exposure device 201, for which the moire correction adjustment has been performed and which is currently mounted on the image forming apparatus main body 211, is stored in the LS memory 313 of the exposure device 201. This makes it possible for the user to know whether or not the exposure device 201 has been subjected to the moire correction adjustment. Note that the stored information is not required to be a serial number insofar as the information makes it possible for the CPU 311 to grasp completion of the moire correction adjustment.

Figure 8:
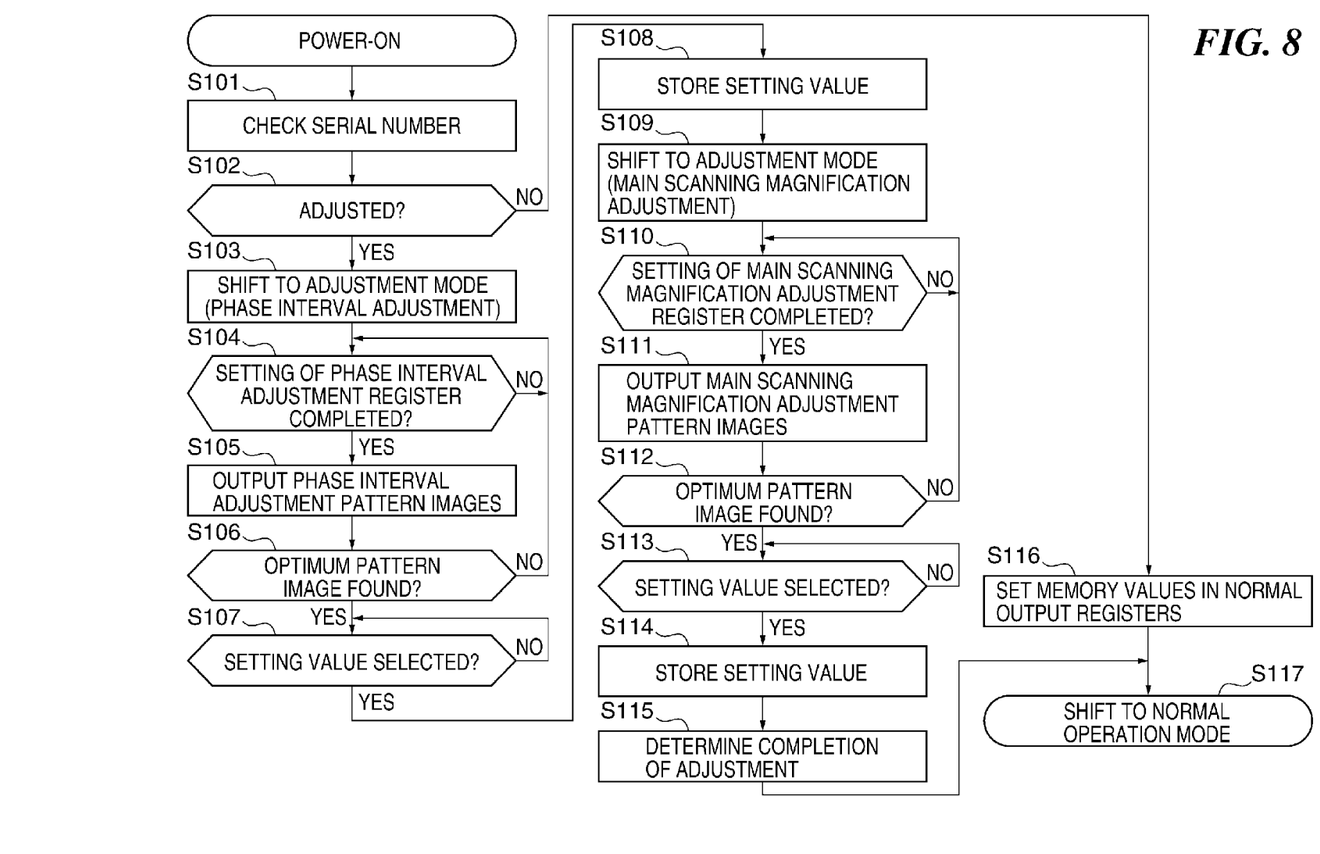
FIG. 8 is a flowchart of a moire correction and adjustment process.

FIG. 8 is a flowchart of a moire correction and adjustment process.

This process is started upon power-on of the image forming apparatus 100. First, in a step S101, the CPU 311 checks the serial number stored in the LS memory 313 belonging to the exposure device 201. By checking the serial number, the CPU 311 determines whether the currently mounted exposure device has been subjected to the moire correction adjustment or it is newly mounted and has not been adjusted yet (step S102). If it is determined in the step S102 that the currently mounted exposure device has been adjusted, i.e. has been subjected to the moire correction adjustment, the CPU 311 proceeds to a step S116.

In the step S116, the CPU 311 reads the phase interval setting value and the main scanning magnification setting value stored in the memory 312, and sets these values in the respective normal output registers of the main scanning magnification register 321 and the laser phase interval register 322. After that, the CPU 311 proceeds to a step S117, wherein the adjustment mode is shifted to a normal operation mode.

On the other hand, if it is determined in the step S102 that the currently mounted exposure device has not been adjusted yet (has not been subjected to the moire correction adjustment), the CPU 311 proceeds to a step S103, wherein the image forming apparatus 100 shifts to a phase interval adjustment mode. After the image forming apparatus 100 shifts to the phase interval adjustment mode, it is necessary to have the user set a register value of the phase interval adjustment register for the adjustment target laser. To set the register value of the phase interval adjustment register, a user interface screen 230 shown in FIGS. 9A to 9C is used.

Figure 9A:
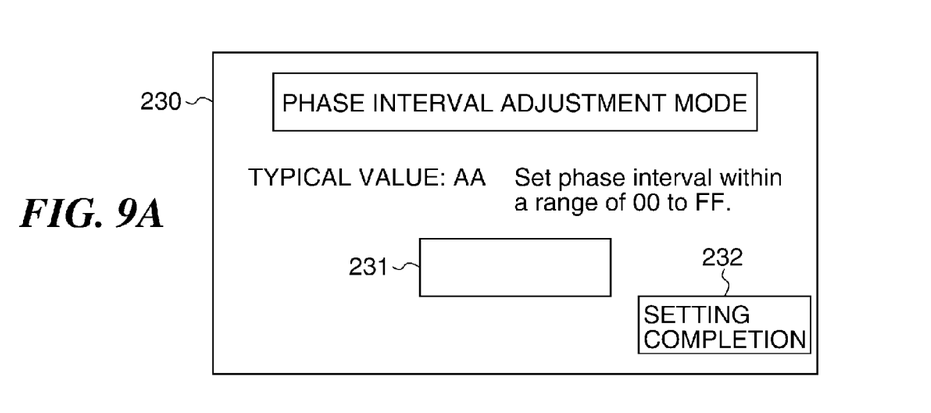
FIGS. 9A, 9B, and 9C are diagrams of examples of a user interface screen used in the moire correction and adjustment process.
Figure 9B:
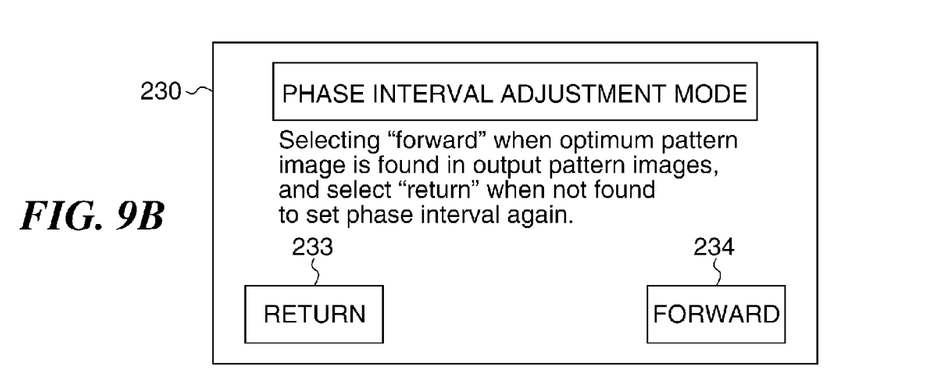
Figure 9C:
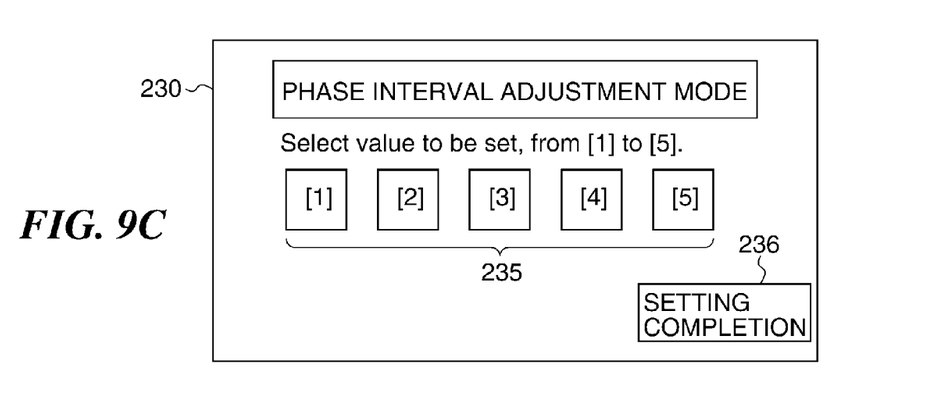

FIGS. 9A to 9C are diagrams of examples of the user interface screen 230 for use in the moire correction adjustment. In the illustrated examples, the user interface screen 230 in the phase interval adjustment mode are shown. The user interface screen 230 is included in a console section (not shown) provided in the image forming apparatus main body 211.

An effective range is set in advance for values which can be set in the phase interval adjustment register, and a setting of the register value therein is received within the range. A typical value which is empirically found to suppress occurrence of moire is set in advance as an initial value of the register value of the phase interval adjustment register.

After the image forming apparatus 100 shifts to the phase interval adjustment mode, first, the user interface screen 230 shown in FIG. 9A is displayed. Then, a value input by the user using ten keys (not shown) is received, and the received value is displayed on a setting display section 231. In a step S104 in FIG. 8, the CPU 311 waits for completion of setting of the phase interval adjustment register. After completion of the input, when the user presses a setting completion button 232 on the user interface screen 230, the CPU 311 determines in the step S104 that the setting of the phase interval adjustment register has been completed, and proceeds to a step S105.

In the step S105, the CPU 311 sends a command to the pattern image generation section 310, and controls the developing device 203, the transfer device 204 and so forth to form phase interval adjustment pattern images (pattern images Ga) (first control unit). More specifically, five kinds of pattern images Ga are formed by the reference laser and the adjustment target laser (FIG. 5). At this time, as described hereinabove, the adjustment target laser performs laser irradiation using the phase setting values different from each other based on the setting of the phase interval adjustment register.

After formation of the pattern images Ga, the user interface screen 230 is changed as shown in FIG. 9B. The user checks the five output pattern images Ga, and if an optimum pattern image with least occurrence of moire is found in the pattern images Ga, the user presses a forward button 234, whereas if no optimum pattern image is found in the pattern images Ga, the user presses a return button 233.

In a step S106, the CPU 311 determines based on the button operation of the user whether or not an optimum pattern image Ga is found. More specifically, when the return button 233 is pressed, the CPU 311 determines that no optimum pattern image is found, and returns to the step S104, wherein the CPU 311 prompts the user to retry to input a phase setting value. In this case, the user inputs a value different from the value input in the immediately preceding occasion on the user interface screen 230 shown in FIG. 9A.

The CPU 311 repeatedly executes the steps S104 to S106 until an optimum pattern image is generated, while having the phase setting value changed. In the step S106, when the forward button 234 is pressed on the user interface screen 230 (FIG. 9B), the CPU 311 determines that an optimum pattern image is found in the pattern images Ga, and proceeds to a step S107.

In the step S107, the user interface screen 230 shown in FIG. 9C is displayed. This user interface screen 230 displays a pattern image group 235. In the pattern image group 235, the same number as displayed in the number display 237 (FIG. 5)

accompanying each of the pattern images Ga is displayed. The user selects a number associated with the selected pattern image from the pattern image group 235 on the user interface screen 230, and presses the number. For example, when it is determined that the pattern image Ga2 is optimum, the user presses a button of bracketed 2 of the pattern image group 235. After selection of the associated number, the user presses a setting completion button 236.

The CPU 311 determines in the step S107 whether nor not a phase setting value has been selected, by determining whether the setting completion button 236 is pressed. That is, the CPU 311 continues the determination until the setting completion button 236 is pressed. When the setting completion button 236 is pressed in a state in which one of the numbers of the pattern image group 235 is selected, the CPU 311 determines that a phase setting value associated with the number in the selected state (e.g. a phase setting value associated with the pattern image Ga2) has been selected. Next, in a step S108, the CPU 311 writes the selected phase setting value as a phase interval setting value in the memory 312. Thus, the phase adjustment is completed.

Next, in steps S109 to S114, the CPU 311 executes adjustment of the main scanning magnification in the same manner as in the phase interval adjustment executed in the steps S103 to S108.

First, when the image forming apparatus 100 shifts to a main scanning magnification adjustment mode in the step S109, for the adjustment target laser, it is necessary to have a register value set by the user in the main scanning magnification adjustment register. Further, for the adjustment target laser, the value stored in the memory 312 as the phase interval setting value in the step S108 is set in the phase interval adjustment register.

Also in setting the main scanning magnification adjustment register, a user interface screen similar to the user interface screen 230 used in setting the phase interval adjustment register is used. Although illustration is omitted, the user interface screen is different from the user interface screen 230, shown in FIGS. 9A to 9C, which is used in the phase interval adjustment mode, only in that the name of a mode is displayed as the "main scanning magnification adjustment mode" and "the phase interval" is displayed as the "main scanning magnification", with the same display of other buttons and the like as displayed for the phase interval adjustment mode.

A value input by the user is received on the user interface screen (corresponding to that shown in FIG. 9A), and the received value is displayed on the setting display section 231. In a step S110 in FIG. 8, the CPU 311 waits for completion of setting of the main scanning magnification adjustment register. After completion of the input, when the user presses the setting completion button 232 on the user interface screen 230, the CPU 311 determines in the step S110 that the setting of the main scanning magnification adjustment register has been completed, and proceeds to a step S111.

In the step S111, the CPU 311 sends a command to the pattern image generation section 310, and controls the developing device 203, the transfer device 204, and so forth to form main scanning magnification adjustment pattern images Gb (second control unit). That is, five kinds of (ten) pattern images Gb are formed by the adjustment target laser (FIG. 7). In doing this, as described hereinabove, laser irradiation by the adjustment target laser is performed using a phase setting value of the phase interval adjustment register, common to the five kinds of pattern images Gb. As for the magnification setting values, the laser irradiation is performed using magnification setting values different from each other based on the setting of the main scanning magnification adjustment register.

After formation of the pattern images Gb, the user interface screen (corresponding to that shown in FIG. 9B) is displayed. The user checks the five kinds of output pattern images Gb, and if an optimum pattern image with least occurrence of moire is found in the pattern images Gb, the user presses the forward button 234, whereas if no optimum pattern image is found in the pattern images Gb, the user presses the return button 233.

In a step S112, the CPU 311 determines based on the button operation of the user whether or not an optimum pattern image Gb is found in the pattern images Gb. More specifically, when the return button 233 is pressed, the CPU 311 determines that no optimum pattern image is found in the pattern images Gb, and returns to the step S110, wherein the CPU 311 prompts the user to retry to input a magnification setting value. In this case, the user inputs a value different from the value input in the immediately preceding occasion on the user interface screen corresponding to that shown in FIG. 9A.

The CPU 311 repeatedly executes the steps S110 to S112 until an optimum pattern image is generated, while having the magnification setting value changed. In the step S112, when the forward button 234 is pressed on the user interface screen (corresponding to that shown in FIG. 9B), the CPU 311 determines that an optimum pattern image is found in the pattern images Gb, and proceeds to a step S113.

In the step S113, the user interface screen corresponding to that shown in FIG. 9C is displayed. In the pattern image group 235 displayed on this user interface screen 230, the same number as displayed in the number display 237 (FIG. 7) accompanying each of the pattern images Gb is displayed. The user selects a number associated with the selected pattern image from the pattern image group 235 on the user interface screen 230, and presses the number. After selection of the number, the user presses the setting completion button 236.

The CPU 311 determines in the step S113 whether nor not a magnification setting value has been selected, by determining whether the setting completion button 236 is pressed. That is, the CPU 311 continues the determination until the setting completion button 236 is pressed. When the setting completion button 236 is pressed in a state in which one of the numbers of the pattern image group 235 is selected, the CPU 311 determines that a magnification setting value associated with the number in the selected state has been selected. Next, in the step S114, the CPU 311 writes the above selected magnification setting value as a main scanning magnification setting value in the memory 312. Thus, the main scanning magnification adjustment is completed.

The steps S103 to S114 are executed on all the light sources except for the reference laser, while sequentially changing the light sources as adjustment target lasers from one to another. The main scanning magnification setting value and the phase interval setting value are stored in the memory 312 in association with respective light sources selected as adjustment target lasers.

After completion of the phase adjustment and the main scanning magnification adjustment of all the light sources, in a step S115, the CPU 311 determines that the moire correction adjustment has been completed. At this time, the CPU 311 stores the serial number of the exposure device 201 in the LS memory 313 such that the CPU 311 can recognize at the next startup of the image forming apparatus 100 that the exposure device 201 which has been subjected to the current moire correction adjustment this time has been adjusted.

After the step S115, the CPU 311 proceeds to the step S117. When CPU 311 proceeds from the step S115 to the step S117, the main scanning magnification setting value and the phase interval setting value which are stored in the memory 312 by the current moire correction adjustment are set in the respective normal output registers of the main scanning magnification register 321 and the laser phase interval register 322. This makes it possible to realize image formation with little occurrence of moire.

As described heretofore, by outputting pattern images formed by changing a phase interval and a main scanning magnification, it is possible to select a phase interval setting value and a main scanning magnification setting value with which moire is reduced, and set them as settings for normal image formation. Since the user visually checks pattern images Ga and Gb actually output, it is possible to accurately determine settings for reducing moire.

Note that in FIGS. 5 and 7, phase setting values and magnification setting values are displayed in numerals together with the pattern images Ga and Gb (value displays 238 and 239). Therefore, it is also possible to employ a method in which the user reads values associated with a pattern image with little moire, and stores the values in the memory 321 or another storage section.

According to the present embodiment, using a laser beam irradiated from a reference laser, and a laser beam irradiated from an adjustment target laser for which each of phase values different from each other is selectively set as a phase setting value, a plurality of pattern images Ga for phase adjustment are formed according to the above respective phase values. Further, using a laser beam irradiated from an adjustment target laser for which each of magnification values different from each other is set as a magnification setting value, a plurality of magnification adjustment pattern images Gb are formed according to the above respective magnification values.

From the above, the user can visually check a plurality of pattern images, to thereby grasp such settings of the phase and main scanning magnification of laser beam as reduce occurrence of moire.

Further, after completion of the phase interval adjustment, the main scanning magnification adjustment is started, and what is more, in the main scanning magnification adjustment, the phase setting value selected in the phase interval adjustment is employed. This makes it possible to accurately grasp such a phase setting values and a magnification setting value as reduce occurrence of moire.

Further, the pattern images Ga are formed in an area where the laser irradiation position is insusceptible to a change in the main scanning magnification, and the pattern images Gb are formed in areas where the laser irradiation position is susceptible to a change in the main scanning magnification. This also makes it possible to accurately grasp such a phase setting value and a magnification setting value as reduce occurrence of moire.

Further, in the exposure device 201 for which the phase interval adjustment and the main scanning magnification adjustment have been completed, the serial number is stored in the LS memory 313, which enables the CPU 311 to quickly recognize at the next startup of the image forming apparatus 100 that the exposure device 201 has been subjected to the moire correction adjustment. Further, even when the exposure device 201 is replaced by a new exposure device 201, the CPU 311 can recognize that the new exposure device 201 has not been subjected to the moire correction adjustment, and quickly start the moire correction adjustment.

Note that it is not essential to perform the phase interval adjustment and the main scanning magnification adjustment in the order of the phase interval adjustment first and the main scanning magnification adjustment next, although the resulting effects of adjustment are inferior.

Further, although in the above-described embodiment, the main scanning magnification setting value and the phase interval setting value are stored in the same memory 312, they may be stored separately from each other.

Further, although in the above-described embodiment, five kinds of pattern images Ga and five kinds of pattern images Gb are formed, this is not limitative, but it is only required that a plurality of kinds thereof are formed, and the numbers of kinds are not limited to five, respectively.

Further, the image forming apparatus to which the present invention is applied may be an apparatus that handles color images. Further, it is only required that the LD 303 has a plurality of light sources, and the number of the light sources is not limited.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application No. 2013-198331 filed Sep. 25, 2013 which is hereby incorporated by reference herein in its entirety.

What is claimed is:

1. An image forming apparatus comprising:
a photosensitive member that is driven for rotation;
an exposure device that includes a plurality of light sources for emitting a plurality of laser beams, respectively, said plurality of light sources being arranged to expose respective different positions in a sub scanning direction which is a rotational direction of said photosensitive member;
an image formation unit configured to form an image by developing an electrostatic latent image formed on said photosensitive member;
a first adjustment unit configured to adjust, by changing a phase setting value, a phase relationship between exposure positions of the plurality of laser beams on said photosensitive member, which is a relative positional relationship between an exposure position of a laser beam irradiated from a reference light source of the plurality of light sources in a main scanning direction of the laser beam perpendicular to the sub scanning direction, and an exposure position of a laser beam irradiated from an adjustment target light source other than the reference light source;

a second adjustment unit configured to adjust a scanning magnification of the laser beam irradiated from each of the plurality of light sources, by changing a magnification setting value;

a first control unit configured to control said exposure device and said image formation unit, such that a plurality of phase adjustment pattern images for adjusting the phase relationship are each formed, using the laser beam irradiated from the reference light source and the laser beam irradiated from the adjustment target light source for which each of phase values different from each other is set as the phase setting value, according to each of the phase values different from each other; and a second control unit configured to control said exposure device and said image formation unit, such that a plurality of magnification adjustment pattern images are each formed, using the laser beam irradiated from the adjustment target light source for which each of magnification values different from each other is set as the magnification setting value, according to each of the magnification values different from each other.

2. The image forming apparatus according to claim 1, wherein said first control unit receives selection of one phase value of the phase values different from each other, and causes the selected phase value to be stored in a first memory, and wherein said second control unit receives selection of one magnification value of the magnification values different from each other, and causes the selected magnification value to be stored in a second memory.

3. The image forming apparatus according to claim 2, wherein when forming the plurality of magnification adjustment pattern images, said second control unit causes the laser beam to be irradiated from the adjustment target light source, using the phase value caused to be stored in the first memory by said first control unit, as the phase setting value.

4. The image forming apparatus according to claim 2, wherein after said first control unit has caused the selected phase value to be stored in the first memory, said second control unit starts the control.

5. The image forming apparatus according to claim 2, wherein said exposure device is replaceable, and includes a storage unit configured to store information indicating that adjustment of said exposure device has been completed, in a case where for each of all the light sources other than the reference light source, the selected phase value is stored in the first memory and the selected magnification value is stored in the second memory.

6. The image forming apparatus according to claim 1, wherein said first control unit causes the plurality of phase adjustment pattern images to be formed in a first area in the main scanning direction; and wherein said second control unit causes the plurality of magnification adjustment pattern images to be formed in a second area in the main scanning direction, where a laser irradiation position on said photosensitive member is more susceptible to a change in magnification than in the first area.

7. The image forming apparatus according to claim 6, wherein the first area includes a position with reference to which adjustment of the scanning magnification is performed by said second adjustment unit.

8. The image forming apparatus according to claim 7, wherein the first area is a central area in the main scanning direction, and the second area is an area closer to an end in the main scanning direction than the central area.

9. A method of controlling an image forming apparatus including a photosensitive member that is driven for rotation, an exposure device that includes a plurality of light sources for emitting a plurality of laser beams, respectively, said plurality of light sources being arranged to expose respective different positions in a sub scanning direction which is a rotational direction of said photosensitive member, an image formation unit configured to form an image by developing an electrostatic latent image formed on said photosensitive member, a first adjustment unit configured to adjust, by changing a phase setting value, a phase relationship between exposure positions of the plurality of laser beams on said photosensitive member, which is a relative positional relationship between an exposure position of a laser beam irradiated from a reference light source of the plurality of light sources in a main scanning direction of the laser beam perpendicular to the sub scanning direction, and an exposure position of a laser beam irradiated from an adjustment target light source other than the reference light source, and a second adjustment unit configured to adjust a scanning magnification of the laser beam irradiated from each of the plurality of light sources, by changing a magnification setting value, the method comprising:

controlling the exposure device and the image formation unit, such that a plurality of phase adjustment pattern images for adjusting the phase relationship are each formed, using the laser beam irradiated from the reference light source and the laser beam irradiated from the adjustment target light source for which each of phase values different from each other is set as the phase setting value, according to each of the phase values different from each other; and controlling the exposure device and the image formation unit, such that a plurality of magnification adjustment pattern images are each formed, using the laser beam irradiated from the adjustment target light source for which each of magnification values different from each other is set as the magnification setting value, according to each of the magnification values different from each other.

* * * * *